United States Patent [19]

Riggio, Jr,

[11] Patent Number: 5,345,197

[45] Date of Patent: Sep. 6, 1994

[54] BATTERY POWERED MAGNETIC PEN HAVING OSCILLATOR WITH IMPROVED EFFICIENCY AND LOW POWER CONSUMPTION

[75] Inventor: Salvatore R. Riggio, Jr,, Boca Raton, Fla.

[73] Assignee: International Business Machines, Armonk, N.Y.

[21] Appl. No.: 3,083

[22] Filed: Jan. 11, 1993

[51] Int. Cl.$^5$ .............................................. H03B 5/12
[52] U.S. Cl. ................................. 331/117 R; 331/68; 331/173; 331/179; 345/179
[58] Field of Search ..................... 331/55, 65, 68, 112, 331/117 R, 117 FE, 173, 179, 187; 178/18, 19, 20; 345/156, 157, 158, 179, 184

[56] References Cited

U.S. PATENT DOCUMENTS

| | | | |
|---|---|---|---|
| 2,910,689 | 10/1959 | Grace | 340/384 |
| 3,033,996 | 5/1962 | Atherton | 307/88.5 |
| 3,263,190 | 7/1966 | Lochanko | 332/29 |
| 3,681,771 | 8/1972 | Hanby | 331/112 |
| 3,719,902 | 3/1973 | Esterly | 331/173 X |
| 4,001,718 | 1/1977 | Wilson et al. | 331/117 R X |
| 4,015,219 | 3/1977 | Kawagoe et al. | 33/57 X |
| 4,065,733 | 12/1977 | Shigemori et al. | 331/112 |
| 4,339,732 | 7/1982 | Kesarwani | 331/109 |
| 4,378,585 | 3/1983 | Bete | 363/19 |
| 4,384,254 | 5/1983 | Brown | 324/253 |
| 4,404,497 | 9/1983 | Takematsu | 315/241 P |
| 4,800,323 | 1/1989 | Sikora | 315/219 |

Primary Examiner—David Mis
Attorney, Agent, or Firm—George E. Grosser; Douglas R. McKechnie

[57] ABSTRACT

A battery-powered, magnetic-pen oscillator includes a circuit having a first transistor arranged in a common emitter configuration. A feedback loop includes a transformer and the transistor that produce a loop phase shift of zero degrees and a loop gain of one to cause oscillation, and additionally creates the magnetic field emitted by the pen. A second transistor provides current mirror biasing for the first transistor and determines the amount of current flowing through the first transistor.

7 Claims, 2 Drawing Sheets

BATTERY POWERED MAGNETIC PEN HAVING OSCILLATOR WITH IMPROVED EFFICIENCY AND LOW POWER CONSUMPTION

RELATED APPLICATION

The following application is assigned to the assignee of this application and is related hereto:

"BATTERY POWERED MAGNETIC PEN WITH TIME OUT TO PREVENT ACCIDENTAL BATTERY DISCHARGE", by S. R. Riggio Jr, filed on even date herewith, Ser. No. 08/003,084.

BACKGROUND OF THE INVENTION

This invention relates to improvements in cordless, battery operated pens for inputting data and information into a tablet computer. More specifically, the invention relates to a pen having an improved low power oscillator.

Cordless and untethered magnetic pens are known in the prior art, which are used to input data into a tablet computer. One such pen emits a modulated radio frequency (RF) signal that is received and demodulated by electronics with the tablet computer. The detected information is used by the system software to determine the location of the pen with respect to a magnetic grid thereby allowing a user to input data into the computer. The pen includes an oscillator which oscillates at two different frequencies to provide a proximity frequency for detecting when the pen is close to engaging the magnetic grid, and a contact frequency for detecting the location of the pen when the pen is in actual contact with the grid. The pen uses a non-rechargeable battery and it is desirable to limit power consumption as much as possible and thereby prolong battery life. Most of the battery power drain is due to the oscillator (as much as 98%) so that it is highly desirable to provide an efficient low-power oscillator.

SUMMARY OF THE INVENTION

One of the objects of the invention is to provide an improved low power oscillator for a battery operated magnetic pen that is usable to enter information into a tablet computer.

Another object of the invention is to provide an improved transformer coupled feedback, common emitter, sinusoidal oscillator that operates at a very low power consumption rate to thereby prolong the useful life of a battery powering the oscillator.

A further object of the invention is to provide an improvement for controlling and limiting the current flowing through a current mirror biased transistor that generates a modulated magnetic RF field in a battery powered magnetic pen.

Still another object of the invention is to provide an improved oscillator for a battery powered magnetic pen, which is more efficient and produces a stronger magnetic field using less power on fewer battery cells.

Briefly, in accordance with the invention, a battery powered magnetic pen oscillator includes a first transistor connected in a common emitter configuration. A feedback loop includes a transformer and the transistor that produce a loop phase shift of zero degrees and a loop gain of one to cause oscillation, and additionally creates the magnetic field emitted by the pen. A second transistor is connected to form current mirror biasing for the oscillator transistor and determines the amount of current flowing through the first transistor.

DRAWINGS

Other objects and advantages of the invention will be apparent from the following description taken in connection with the accompanying drawings wherein.

DETAILED DESCRIPTION

Figure 1:
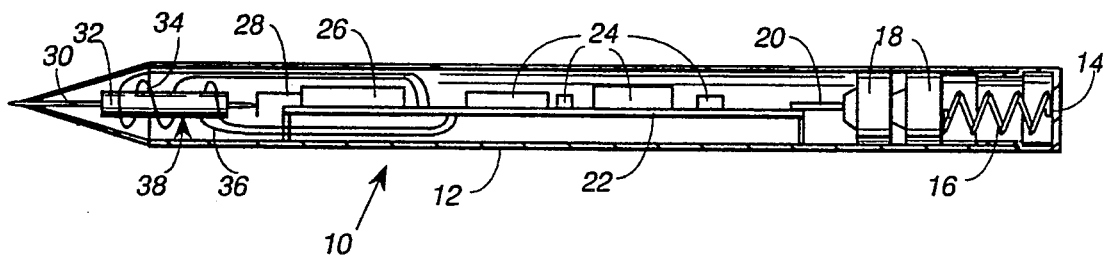
FIG. 1 is a simplified longitudinal elevation view, with casing portions removed, of a magnetic pen in accordance with the invention.

Referring now to the drawings, and first to FIG. 1, there is shown an untethered, cordless magnetic pen 10 that is usable with a tablet computer (not shown) for inputting data into the computer. Pen 10 comprises a casing 12 of a size adapted to be hand held and manually manipulated thereby allowing the user to use the pen in a manner similar to using an ordinary writing pen. Casing 12 is hollow, and tubular and is open at one end to receive a cap 14. The cap biases a spring 16 against a two cell battery 18 which in turn abuts a contact 20 for supplying power from the battery to electronic components 24 mounted on a printed circuit board (PCB) 22. The positive side of battery 18 is electrically connected through spring 16 to casing 12 while the negative side forms a ground for the circuitry. A single-pole, single-throw, normally-closed microswitch 26 is also mounted on PCB 22 and has a longitudinally movable actuating rod 28 engaged with the inner end of a longitudinally movable rod 30. A spring (not shown) within switch 26 biases rods 28 and 30 longitudinally outwardly against a stop means (not shown) whereby the outer end or tip of rod 30 projects outwardly from casing 12 for engagement with the magnetic grid of the computer. When the pen is brought into engagement or contact with an object such as the grid of the tablet computer, rod 30 is moved longitudinally inwardly against rod 28 and actuates switch 26 causing it to open. When the pen is subsequently disengaged from the grid, the spring bias within switch 26 causes the switch to close and also returns rods 28 and 30 to their normal, unactuated positions.

Figure 2:
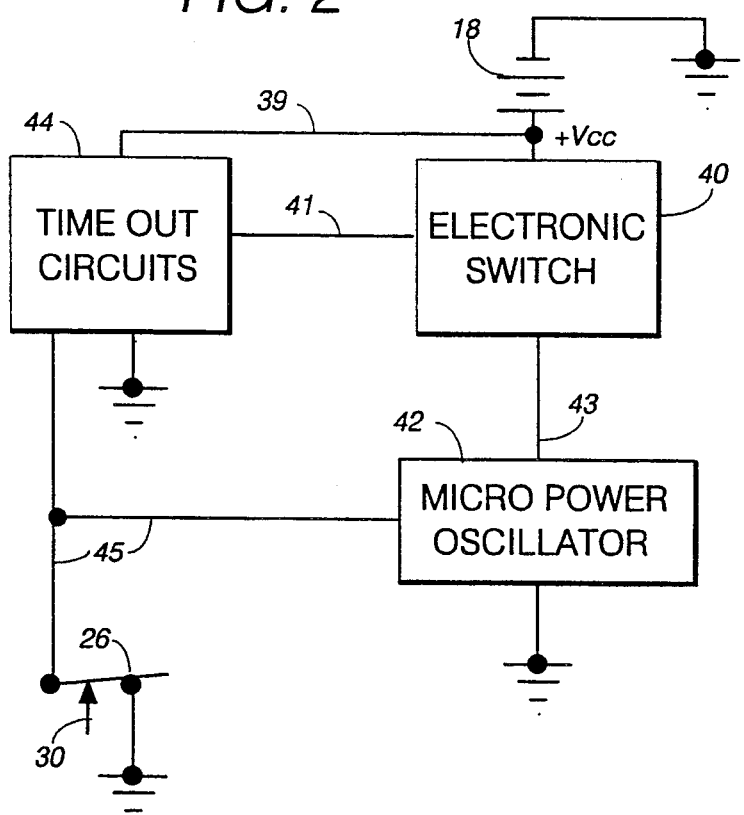
FIG. 2 is a block diagram of circuitry included in the pen shown in FIG. 1.

Also included in pen 10 is a stationary, tubular magnetic core 32 through which rod 30 freely passes. Two inductor coils 34 and 32 are wrapped around core 32 to form a transformer 38 that is part of an oscillator 42 (FIG. 2). The transformer generates a magnetic field that extends longitudinally outwardly from the tip of the casing and is detectable by the magnetic grid of the tablet computer.

Referring to FIG. 2, battery 18 supplies a +Vcc power supply voltage over power line 39 to a normally open electronic switch 40 and to time out circuits 44 which provide actuating signals over line 41 for controlling the switching operation of switch 40. A micro power oscillator 42 is connected by line 43 to receive +Vcc power when switch 40 is closed. Time out circuits 44 are further connected by a line 45 to one side of switch 26, the other side of which is grounded. Line 45 is also connected to oscillator 42. The details of time out circuits 44 are shown and described in the above-identified related application.

The general operation of the circuit shown in FIG. 2 is as follows. Assume at the start that tip 30 is disengaged from any external object. In such a situation, switch 26 is closed, switch 40 is open, and oscillator 42 is off. When the tip 30 of pen 10 is brought into engagement with the grid, switch 26 is opened. In response to the opening of switch 26, time out circuits 44 send a signal on line 41 causing switch 40 to close and thereby supply +Vcc power to oscillator 42 causing it to oscillate at a first frequency signifying engagement with the grid. When switch 40 is closed, oscillator 42 oscillates at two different frequencies dependent on whether switch 26 is open or closed. The first frequency is a "contact" frequency signifying that the pen is engaged with the grid. The second frequency is a "proximity" frequency for detecting when the pen is close to the grid. Thus, as a user manipulates the pen relative to the grid moving it alternately between engaged and disengaged positions, switch 26 is alternately opened and closed causing the oscillator to shift or modulate frequencies between the contact frequency and the proximity frequency. The time out circuits 44 operate to keep switch 40 closed so long as the pen has not been engaged with or disengaged continuously from the grid for more than a predetermined time out period. Should the pen remain engaged or disengaged continuously for a period greater than the time out period, switch 40 is opened thus shutting off oscillator 42. The time out circuit requires pen up and pen down action within the time out period to insure that switch 40 remains close thereby allowing the oscillator to continue emitting the RF field during normal usage with the tablet computer. A time out period of about one minute is suitable and conserves battery power by shutting off the oscillator. The time out circuits also prevent accidental battery discharge, as described in the above-identified related application.

Figure 3:
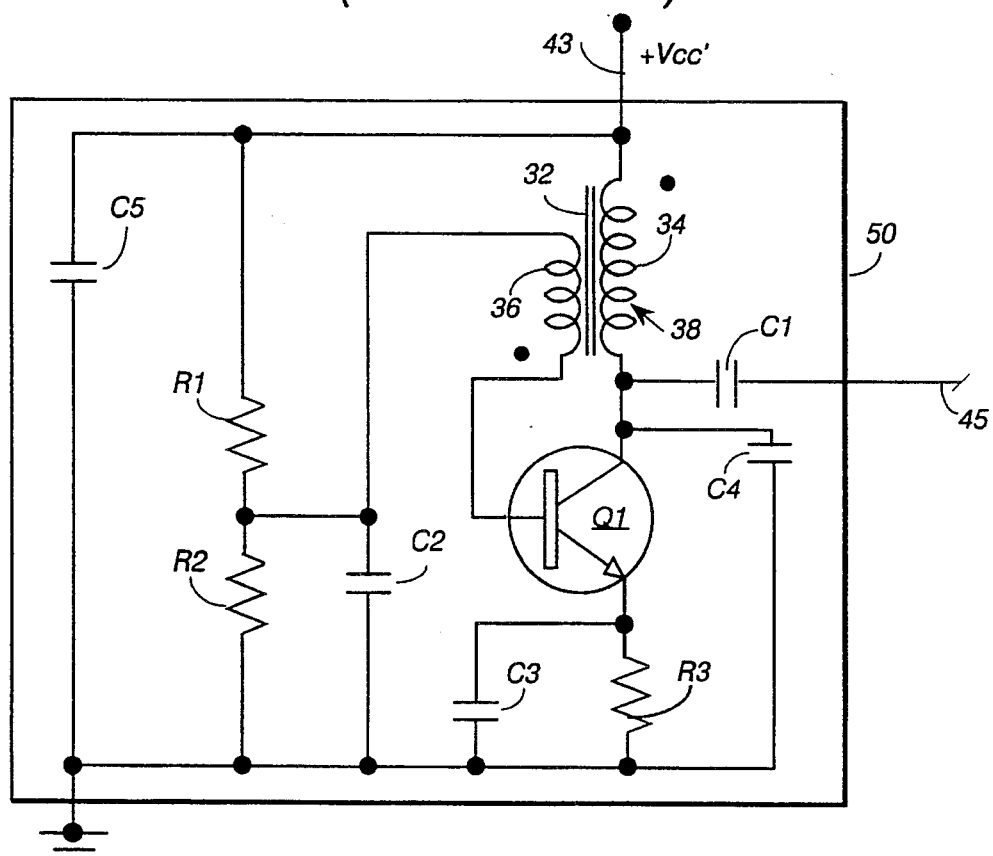
FIG. 3 is a detailed circuit diagram of an oscillator within the prior art, which the invention is designed to improve upon.

With reference to FIG. 3, the prior art teaches the use of a transformer coupled feedback, common emitter, sinusoidal oscillator circuit 50. Oscillator 50 comprises a NPN transistor Q1 having its collector connected through inductor 34 to +Vcc' (which comes from three battery cells) and its emitter connected to ground through the parallel combination of resistor R3 and capacitor C3. The collector is also connected to capacitors C4 and C1 which in turn are respectively connected to ground and to line 45. The base of Q1 is connected to one end of inductor 36. The other side of inductor 36 is connected to a grounded capacitor C2 and to the middle of a resistor voltage divider comprising resistors R1 and R2. These resistors are connected in series between line 43 and ground. A power supply bypass capacitor C5 is also connected between line 43 and ground in parallel to resistors R1 and R2.

Resistors R1 and R2 provide a DC base bias voltage, and resistor R3 determines the DC operating current of transistor Q1. Capacitor C3 provides an AC low impedance path to ground for the emitter current of transistor Q1, and capacitor C2 provides a low impedance path to ground for the secondary of transformer 38. Transformer 38 is connected in a feedback loop and provides a 180 degree phase shift which, in addition to the 180 degree phase shift produced by transistor Q1, yields a loop phase shift of zero degrees as required for oscillation. A feedback loop gain of one is achieved by setting the DC bias current to yield a predetermined value of transconductance, and then by adjusting the transformer turns ratio. The frequency of oscillation is determined by the inductance value of the transformer's primary side 34 and the capacitance value of capacitors C4 and C1 for the proximity frequency and the contact frequency.

Figure 4:
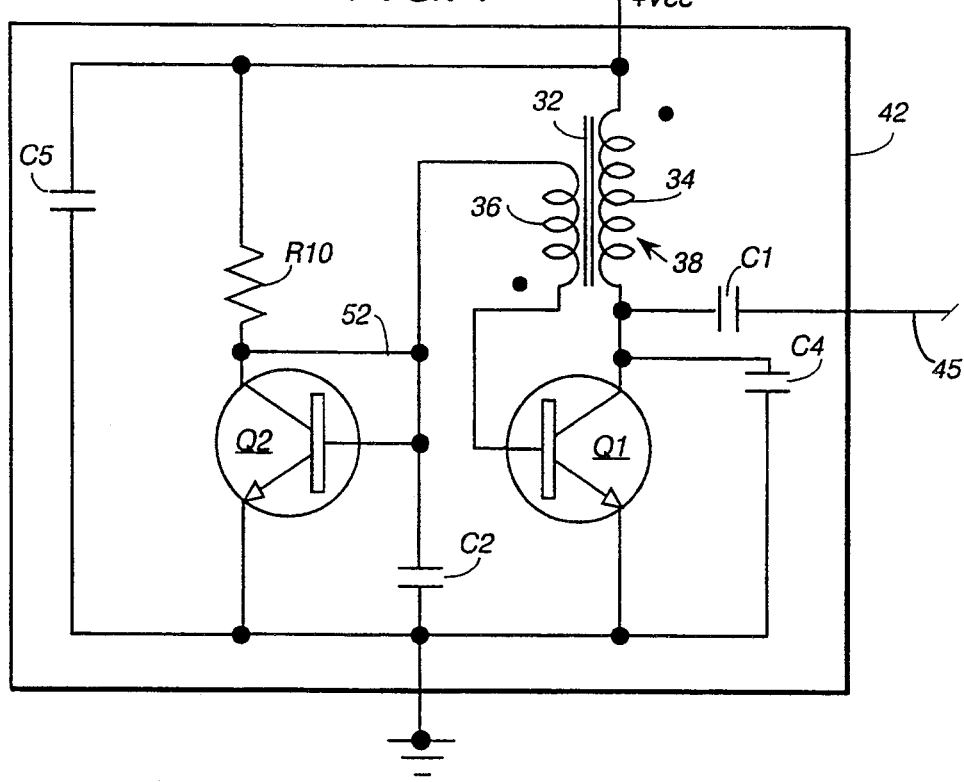
FIG. 4 is a circuit diagram of an oscillator constructed in accordance with the invention.

Referring to FIG. 4, oscillator 42 is also a transformer coupled feedback, common emitter, sinusoidal oscillator. Relative to oscillator 50 though, oscillator 42 does not include resistors R2 and R3, nor capacitor C3, but oscillator 42 does include a second transistor Q2. Further, resistor R1 is replaced by a resistor R10 having a value and function described below. The elimination of resistor R3 is significant since such resistor is located in the high current emitter path of Q1 where the resistor contributes nothing to the radiated power but actually consumes power that is dissipated as heat. The removal of resistor R3 increases the efficiency of the oscillator 42 whereby the pen produces a stronger magnetic field using less power on fewer battery cells, and the life of the battery is extended. Transistor Q1 also consumes some power, however this is unavoidable since transistor Q1 is required for an oscillation to take place. Also, since the emitter of Q1 is grounded directly, capacitor C3 is no longer required.

In oscillator 42, transistor Q1 is connected as above, except that the emitter of Q1 is connected directly to ground. The base of transistor Q1 is connected to one end of inductor 36. The other end of inductor 36 is connected to capacitor C2, and to the collector and base of transistor Q2, by conductor 52. Such conductor provides a point of common or equal DC potential. The collector of Q2 is also connected to R10, while the emitter of Q2 is connected to ground. Additionally, transistors Q1 and Q2 having matching characteristics to maintain a good DC bias temperature stability. This also provides for a reasonably stable transconductance value (gm), yielding good loop stability, as transconductance is directly dependent on the DC operating current.

A resonant condition is required for oscillation. The resonant condition is established by the inductance of coil 34 and the capacitance of C4 when switch 26 is open and of C1 and C4 when switch 26 is closed. Oscillation also requires a positive feedback with a zero degree phase shift around the "loop". The "loop" extends from the base of Q1, through the collector of Q1, and through transformer winding 34 and then winding 36 back to the base of Q1. Transistor Q1 is connected in a common emitter configuration and thus a signal on the base is 180 degrees out of phase with a signal on the collector. The windings 34 and 36 of transformer 38 are wound in opposite directions as indicated by the dots on the transformer whereby the secondary coil 36 provides a 180 degree phase shift relative to the primary winding. Since the transformer is in the loop, the additive or net effect of the two phase shifts is to cancel each other and produce a zero degree phase shift around the loop.

The third condition for oscillation is to have a closed loop gain of one to make up for circuit losses in the feedback loop. The gain is achieved by having an active circuit connected to the battery. A voltage gain is obtained between the base and collector of Q1 due to the turns ratio of the windings of transformer 38. The turns ratio is selected relative to the gain of the transistor to achieve a gain of one around the loop. To get such gain, Q1 is operated as an amplifier and biased into its active region by Q2 and R10.

The remaining elements in the circuit of oscillator 42 are capacitors C2 and C5. These create an AC ground for decoupling the DC point to ground. Thus, C5 is connected between line 43 and winding 34 and ground, and capacitor C2 is connected between the DC point at the transistor bases and ground. C2 provides an AC path for secondary winding 36, and C5 provides an AC path for primary winding 34.

The voltage drop across R10 biases the bases of both transistors Q1 and Q2 to the same DC bias whereby the base-to-emitter voltages are the same for both Q1 and Q2. To DC voltages, coil 36 offers no resistance which means the base of Q1 is tied directly to the base of Q2. If the base-to-emitter voltage of Q2 is same as that of Q1, then the current that flows in the collector and emitter of Q2 is the same as the current that flows in the collector and emitter of Q1. Voltage +Vcc minus the base emitter voltage of Q2, divided by the resistance of R10 equals the approximate current flowing in Q2. To get lowest possible current and thereby the lowest battery drain, R10 is selected to produce a collector current of about 20 microamperes.

Transistors Q1 and Q2 are matched transistors, meaning they are of the same type having the same thermal voltage, current gain, and device saturation current characteristics. Transistors Q1 and Q2 form a current mirror that provides a unique way to bias the sinusoidal oscillator. The transistors have a current gain that is very large compared to a gain of one. Since both have the same base-to-emitter voltage, (Vbe of Q2=Vbe of Q1), the collector current of Q1 equals that of Q2. The current mirror has a one-to-one current ratio thereby allowing the operating current in transistor Q1, which is the same as that of transistor Q2, to be set by picking a battery voltage from which to operate, and subsequently adjusting resistor R10 for the desired value of current. Thus the resistance value of R10 not only sets the current flowing through both transistors Q1 and Q2, it sets the base-to-emitter bias voltages.

It should be apparent to those skilled in the art that many changes can be made in the details and arrangements of steps and parts without departing from the scope of the invention as defined in the appended claims.

What is claimed is:

1. A battery powered magnetic pen comprising:
   a power source comprising battery for providing DC power to operate said pen, said battery having one terminal connected to ground;
   and an oscillator connected between a second terminal of said battery and said ground, said oscillator comprising
   a first transistor having a first base, a first collector, and a first emitter, said first emitter being connected directly to ground,
   a transformer having a primary winding connected in series between said battery and having said first collector, said transformer further having a secondary winding connected to said first base and forming a feedback loop from said collector through said transformer to said first collector, said feedback loop providing zero loop phase shift and a loop gain of one,
   capacitor means connected to said primary winding and said first emitter and having a capacitance related to the inductance of said primary winding to establish resonant conditions and cause said oscillator to oscillate,
   a second transistor having a second base, a second collector, and a second emitter, said second emitter being connected to ground,
   conductor means connected to said second base, said second collector, and said secondary winding for creating a common point of equal DC potential, and
   a resistor connected in series between said battery and said conductor means for providing a DC bias to said common point, said resistor having a resistance setting base-to-emitter voltages and amount of current flowing through said first and second collectors, of said first and second transistors.

2. A magnetic pen in accordance with claim 1 wherein:
   said capacitance means comprises first and second capacitors, said first capacitor being connected between said first collector and ground;
   and said pen further comprises a switch connected between said second capacitor and ground, whereby actuation of said switch alternately connects said second capacitor to ground and disconnects said second capacitor from ground thereby modulating said oscillator between two different frequencies for signifying pen contact and pen proximity positions.

3. A magnetic pen in accordance with claim 2 comprising:
   an elongated casing for housing said power source, said oscillator, and said switch;
   a movable tip mounted at one end of said casing in engagement with said switch for actuating said switch in response to predetermined movements of said tip;
   said transformer being mounted in said one end of said casing to emit a magnetic field that is modulated at said two different frequencies in response to actuation of said switch.

4. A magnetic pen in accordance with claim 3 wherein said pen further comprises:
   a selectively actuated second switch connected between said battery and said oscillator for switching said oscillator on and off.

5. A magnetic pen in accordance with claim 4 comprising:
   a third capacitor connected to said conductor and ground to provide an AC path to ground for said secondary winding;
   and a fourth capacitor connected to said primary winding to provide an AC path to ground for said primary winding.

6. A magnetic pen in accordance with claim 1 wherein said first and second transistors are of the same type and have matching characteristics, whereby the current flowing in said first transistor has the same magnitude as that of the collector current in said second transistor.

7. A magnetic pen in accordance with claim 6 wherein said resistor sets the same base-to-emitter voltages on both transistors.

* * * * *